(12) United States Patent
Yanamadala

(10) Patent No.: US 10,955,864 B2
(45) Date of Patent: Mar. 23, 2021

(54) CONTEXT-AWARE POWER NETWORK

(71) Applicant: Arm Limited, Cambridge (GB)

(72) Inventor: Subbayya Chowdary Yanamadala, Dallas, TX (US)

(73) Assignee: ARM LIMITED, Cambridge (GB)

( * ) Notice: Subject to any disclaimer, the term of this patent is extended or adjusted under 35 U.S.C. 154(b) by 322 days.

(21) Appl. No.: 15/913,051

(22) Filed: Mar. 6, 2018

(65) Prior Publication Data

US 2019/0278311 A1 Sep. 12, 2019

(51) Int. Cl.
| | |
|---|---|
| *G05F 1/46* | (2006.01) |
| *G06F 1/08* | (2006.01) |
| *H03K 5/00* | (2006.01) |
| *G06F 1/26* | (2006.01) |
| *H02J 7/34* | (2006.01) |
| *H02J 1/14* | (2006.01) |

(52) U.S. Cl.
CPC .................. *G05F 1/46* (2013.01); *G06F 1/08* (2013.01); *G06F 1/26* (2013.01); *H02J 1/14* (2013.01); *H02J 7/34* (2013.01); *H03K 5/00006* (2013.01)

(58) Field of Classification Search
CPC ...... G05F 1/26; G05F 1/46; G06F 1/08; H02J 1/14; H02J 7/34; H03K 5/00006
See application file for complete search history.

(56) References Cited

U.S. PATENT DOCUMENTS

| | | | | |
|---|---|---|---|---|
| 7,602,593 B2* | 10/2009 | Asano | ..................... | G06F 1/305 361/18 |
| 9,882,472 B2* | 1/2018 | Cowley | ..................... | G05F 1/56 |
| 2009/0267588 A1* | 10/2009 | Schmitz | ..................... | H02J 1/14 323/352 |
| 2010/0264890 A1* | 10/2010 | Caldwell | ..................... | G05F 1/56 323/282 |
| 2018/0059761 A1* | 3/2018 | An | ..................... | H02J 1/10 |

OTHER PUBLICATIONS

International Search Report and Written Opinion issued in PCT/GB2019/050595, dated May 28, 2019, 12 pages.

* cited by examiner

*Primary Examiner* — Patrick O Neill
(74) *Attorney, Agent, or Firm* — Talem IP Law, LLP

(57) ABSTRACT

A configurable charge storage network and control system provide a context-aware power network for a system including a circuit, the power network coupled to the circuit to provide a core voltage to the circuit; and a context-based controller that monitors a supply voltage level of a power supply, monitors a core voltage level of the core voltage, and monitors activity of the circuit to derive an activity level of the circuit; and based on the activity level of the circuit, adjusts a capacitance of the power network or charging parameters associated with the power network to correspond to a power requirement associated with the activity level.

20 Claims, 10 Drawing Sheets

CONTEXT-AWARE POWER NETWORK

BACKGROUND

Charge storage devices such as capacitors may be used to supply power to Integrated Circuit chips either in their entirety or to part of the circuitry on the chip. The size (capacity) of a power capacitor determines the amount of charge it can hold which in turn determines the amount of power it can supply to the circuitry.

BRIEF SUMMARY

A configurable charge storage network and control system that adjusts a charge storage device configuration of the charge storage network based on the needs of an integrated circuit are described. The adjustment can be for present or anticipated needs of the integrated circuit.

A system is described that includes a circuit (e.g., an integrated circuit); a power network coupled to the circuit to provide a core voltage to the circuit; and a context-based controller that monitors a supply voltage level of a power supply, monitors a core voltage level of the core voltage, and monitors activity of the circuit to derive an activity level of the circuit. The context-based controller can, based on the activity level of the circuit, adjust a capacitance of the power network or charging parameters associated with the power network to correspond to a power requirement associated with the activity level.

A context-aware power network can include at least one charge storage unit; and a context-based controller comprising at least one input receiving a context of circuitry operation; and at least one control signal output, the at least one control signal output being coupled to the at least one charge storage unit, wherein the context-based controller determines an activity level for a circuit based on the context of the circuitry operation received via the at least one input, and generates at least one control signal to output via the at least one control signal output based on a power requirement corresponding to the determined activity level.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

A configurable charge storage network and control system that adjusts a charge storage device configuration of the charge storage network based on the needs of an integrated circuit are described. The adjustment can be for present or anticipated needs of the integrated circuit.

Figure 1A:
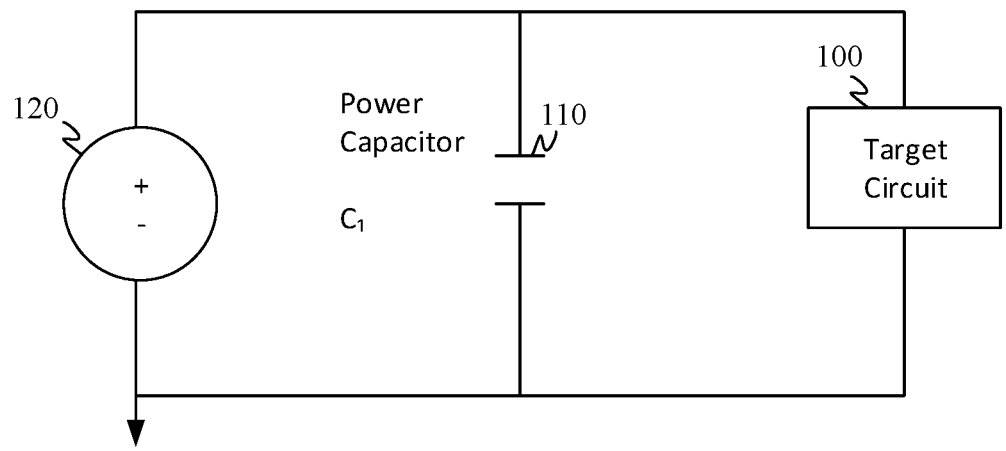
FIGS. 1A and 1B illustrate a simplified configuration of a target circuit that utilizes a capacitor as a power supply (FIG. 1A) and an example activity profile associated with the target circuit (FIG. 1B).
Figure 1B:
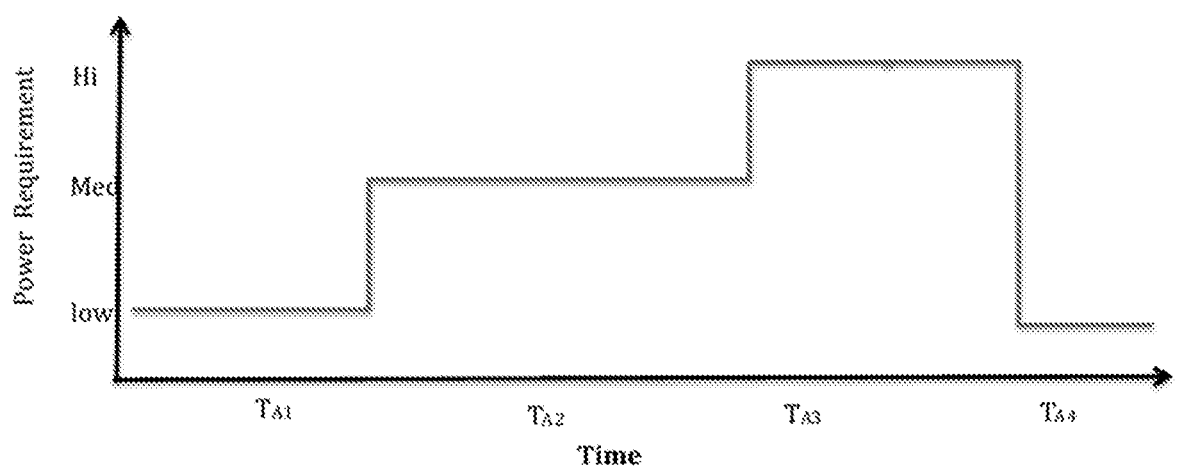

FIG. 1A illustrates a simplified configuration of a target circuit that utilizes a charge storage device as a power supply; and FIG. 1B shows an example activity profile associated with the target circuit. Referring to FIG. 1A, a target circuit 100 may use charge accumulated on the charge storage device 110, represented by power capacitor C1, to operate independent of the power supply 120. The target circuit 100 may require different amount of charge depending on activity level. For example, as illustrated in FIG. 1B, the target circuit 100 may have a low power requirement during time period TA1, a medium power requirement during time period TA2, a high power requirement during time period TA3, and a low power requirement during time period TA4.

Among various considerations in selecting an appropriate capacitance for supplying power to a target circuit, selecting the appropriate size capacitor (when used as a charge storage device for the target circuit) can be considered one of the critical considerations. The size of the capacitor or the amount of capacitance available from the charge storage device (for cases where the charge storage device may not be a capacitor) is selected in order to be able to supply the power to circuitry while maintaining the voltage output of the capacitor or other charge storage device within an accepted range for the dependent circuitry to function properly. For example, when a capacitor is used as the charge storage device, the size of the capacitor is usually chosen to be large enough to withstand the worst-case activity levels of the circuitry (which is usually high current requirements). While a large capacitor can supply sufficient power to service larger circuits/intense activity, the size of the capacitor has additional impacts such as increased cost of manufacture due to the large area of silicon the capacitor may occupy; increased power consumption due to higher current/power required to charge the capacitor; and increased time to charge the capacitor to capacity.

As illustrated by the example of FIG. 1B, the activity of the target circuitry is often not constant; and may vary in intensity. A power capacitor is often sized up to handle the worst-case activity levels. This forces the chip designer to potentially select larger than needed size capacitor (and thereby larger power and performance overheads) during the time when activity levels are lower (where a smaller capacitor could be used). Advantageously, the described configurable charge storage network and control system that adjusts a charge storage device configuration can be implemented, in various embodiments, to minimize one or more of area, power consumption, and time to charge.

The described configurable charge storage architecture is able to be aware and adapt the capacitance level to the context of the circuit operation. The context can be set based on time, mode of operation, voltage level, current draw, and/or other operating parameters.

Figure 2A:
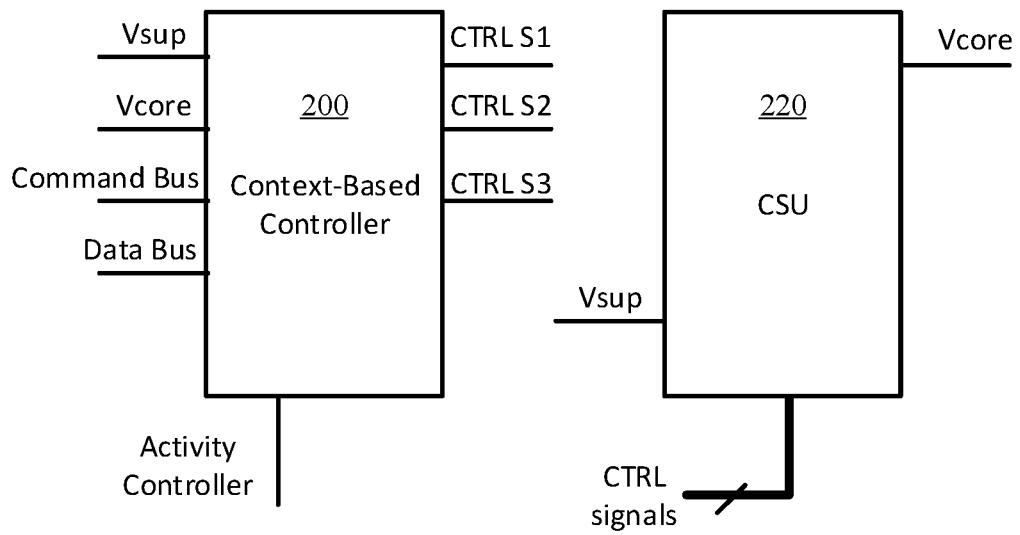
FIGS. 2A and 2B illustrate an example configurable charge storage architecture.
Figure 2B:
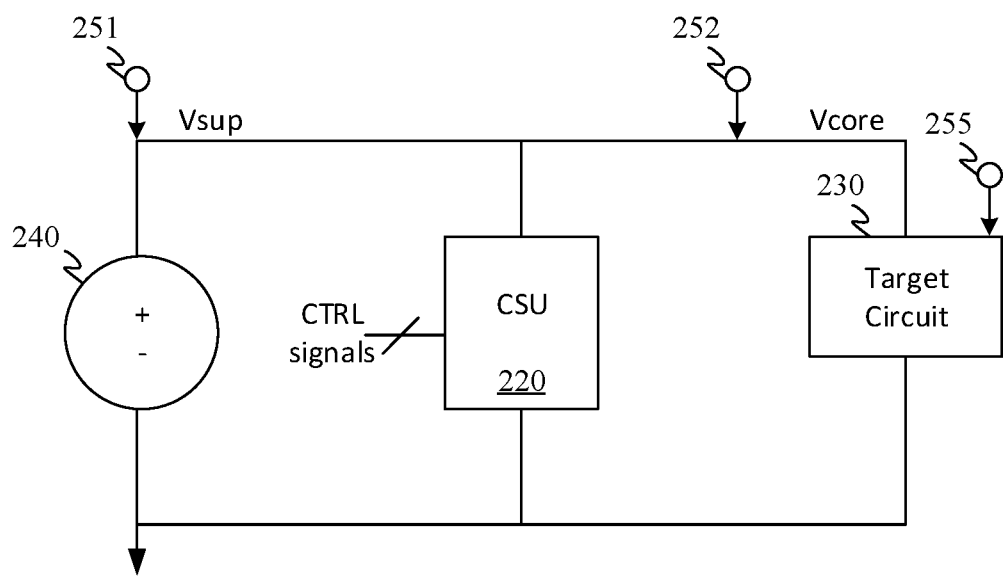

FIGS. 2A and 2B illustrate an example configurable charge storage architecture. Referring to FIGS. 2A and 2B, a context-based controller 200 can receive any number of inputs regarding circuitry operation and generate appropriate control signals (e.g., CTRL S1, CTRL S2, CTRL S3, . . . ) for controlling one or more charge storage units (CSUs) 220. For example, a number of operating parameters can be monitored and provided as inputs regarding circuitry operation, including operation of a target circuit 230. The context can be derived, for example, by monitoring the supply voltage level on the voltage supply (Vsup) output by the power supply 240, for example via tap 251, and monitoring the core voltage level on the core voltage Vcore supplied by the CSU 220, for example via tap 252. In some cases, the context-based controller 200 generates the control signals based on the voltage drop or gradient on the voltage supply or the core voltage over time. In some cases, the context-based controller 200 generates the control signals based on the voltage difference between the voltage supply and the core voltage. In some cases, the controller can generate the appropriate signals by incorporating or accessing a signal generator and applying appropriate pulse width or frequency modulation. In some cases, the controller can generate the appropriate signals by connecting a DC voltage to the control output line.

The context can also or alternatively be derived, for example, by monitoring an activity of the circuit (e.g., actual activity data or commanded activity). For example, the context can be derived by monitoring a command bus or a data bus associated with the target circuit 230 (the monitoring represented by tap 255). The context-based controller 200 may, in some cases, monitor a sequence of commands or control signals (e.g., from the command bus associated with the target circuit 230) and/or a sequence of data (e.g., via the data bus of the target circuit 230). The sequence of commands or control signals or the sequence of data can be used by the context-based controller to determine activity level (and corresponding power requirement) of the target circuit 230. In some cases, the context-based controller 200 can receive an activity indicator from, for example, an activity controller or other controller or processor used in the system. The activity indicator can directly or indirectly indicate the level of power required for the target circuit 230. In some cases, the activity indicator can directly indicate the level of power required by being a signal or signals indicating a high, a medium, or a low power requirement (or other number of levels). In some cases, the activity indicator can indirectly indicate the level of power required by being a signal that the context-based controller 200 can use to derive the appropriate power level. In some cases, the activity controller performs the monitoring of the command or data bus and determines the corresponding activity level in order to provide the activity indicator to the context-based controller 200.

In some cases, a combination of any of the above-mentioned context may be used by the context-based controller 200 to determine the appropriate control signals. The charge storage unit 220 can receive the appropriate control signals (e.g., CTRL signals), which correspond to one or more of CTRL S1, CTRL S2, CTRL S3, and any other control signals used to operate the CSU 220. Using the control signals, the context-based controller 200 can adjust the capacitance of the charge storage unit 220 or the charging parameters associated with the charge storage unit 220 (such as charging frequency). In some cases, such as described in more detail with respect to FIG. 11, the context-based controller 200 can adjust the voltage level or frequency for the target circuit based on the power demand, for example, lowering the operating frequency of the target circuit during a higher power demand situation; or stalling or delaying some operations from happening in parallel, for example, when a target circuit is engaged. In some cases, some of the non-essential operations can be scheduled to a later time in order to manage, and possibly stagger, peak power demand.

The context-based controller 200 may include or have access to registers or other memory storing appropriate mappings for the power requirement and corresponding control signals based on the context inputs received. For example, an indication of an AES start command, in a case where the target circuit 230 includes at least part of an encryption circuit, can indicate to the context-based controller 200 that the target circuit 230 will be consuming more power in order to perform an encryption function; and the registers or other memory can be accessed to identify the appropriate control signals to apply according to the identification that the AES start command has been found on the command bus.

Figure 3:
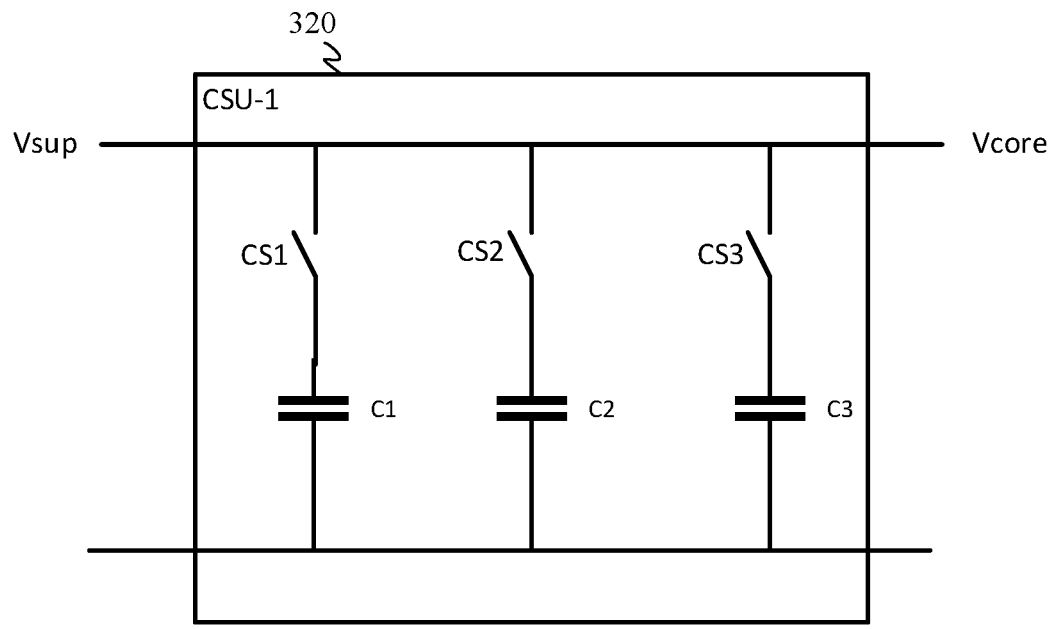
FIG. 3 illustrates an example charge storage unit.
Figure 4:
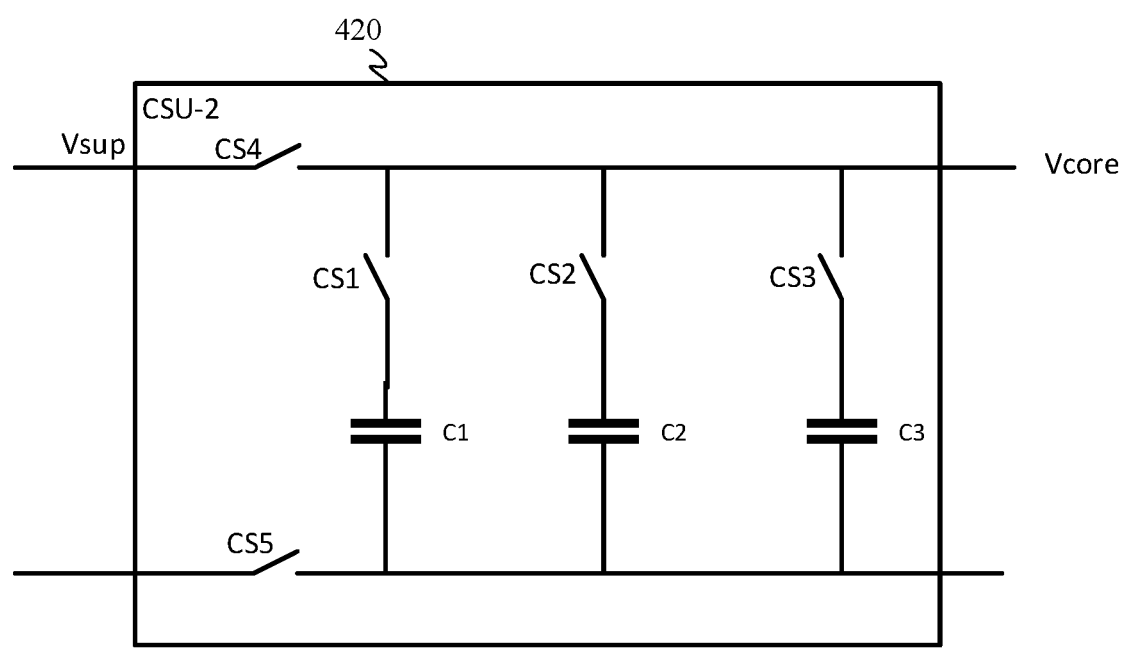
FIG. 4 illustrates another example charge storage unit.

FIG. 3 illustrates an example charge storage unit; and FIG. 4 illustrates another example charge storage unit. Referring to FIG. 3, a charge storage unit CSU-1 320 may include a plurality of charge storage devices, represented by parallel capacitors C1, C2, and C3; and switches S1, S2, S3, which connect a corresponding charge storage device to the power supply (Vsup) and a target circuit (not shown) to provide a core voltage (Vcore). The example charge storage unit CSU-2 420 of FIG. 4 further includes switches S4 and S5, which can be used to controllably isolate the charge storage unit 420 from the power supply (Vsup). It should be understood that the number of charge storage devices (and corresponding switches) may be more or fewer than that illustrated. In addition, in some cases, more than one type of charge storage device may be contained in a single charge storage unit.

Figure 5A:
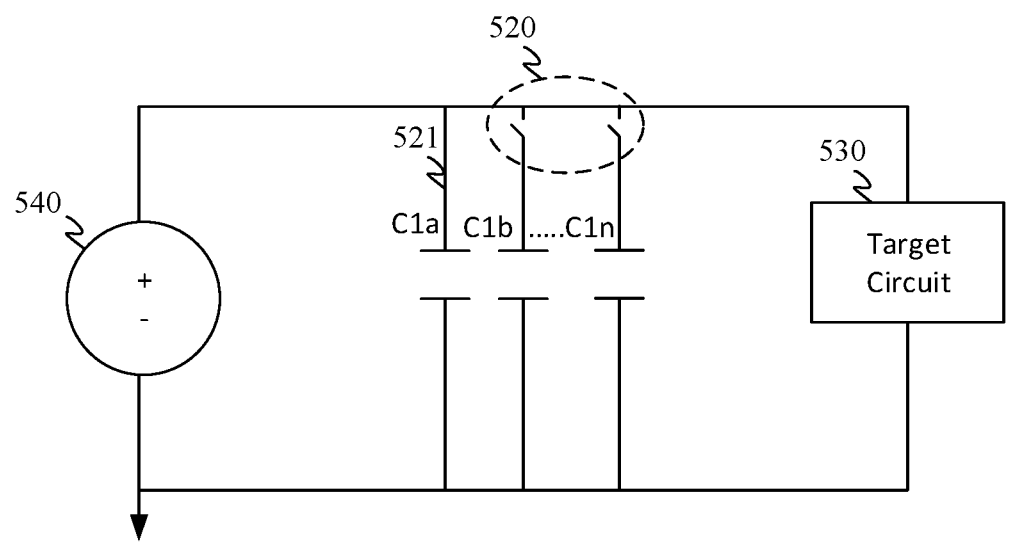
FIGS. 5A-5D illustrate an example application of a configurable charge storage network for supplying power for the example activity profile of FIG. 1B.

FIGS. 5A-5D illustrate an example application of a configurable charge storage network for supplying power for the example activity profile of FIG. 1B. Referring to FIG. 5A, for the time TA1, the context-aware controller may have determined from context that nominal (low level) activity is being (or will be) carried out and generates control signals to connect a charge storage device corresponding to a smaller capacitor. For example, most switches 520 may remain open such that one charge storage device 521 is coupled to the target circuit 530. In some cases, the charge storage device 521 is coupled a period of time before target circuit operation begins in order to accumulate charge from the power supply 540.

Figure 5B:
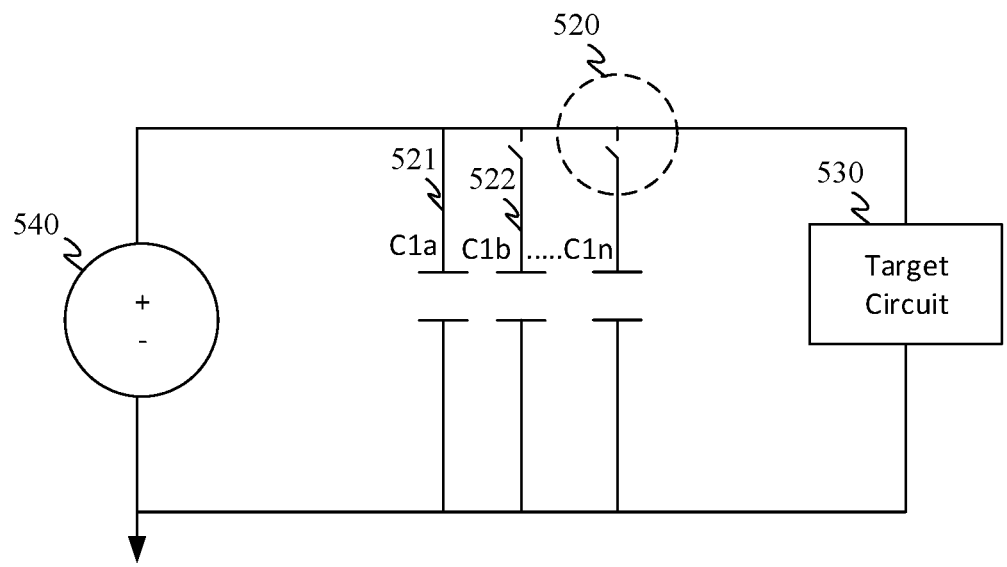

Referring to FIG. 5B, for the time TA2, the context-aware controller may have determined from context that medium level activity is being (or will be) carried out and generates control signals to connect sufficient number of charge storage devices to support appropriate voltage needs of the circuit for a predefined medium level activity. For example, some switches 520 may remain open such that two (or more) charge storage devices 521, 522 are coupled to the target circuit 530. In some cases, the charge storage devices 521, 522 are coupled a period of time before target circuit operation begins in order to accumulate charge from the power supply 540.

Figure 5C:
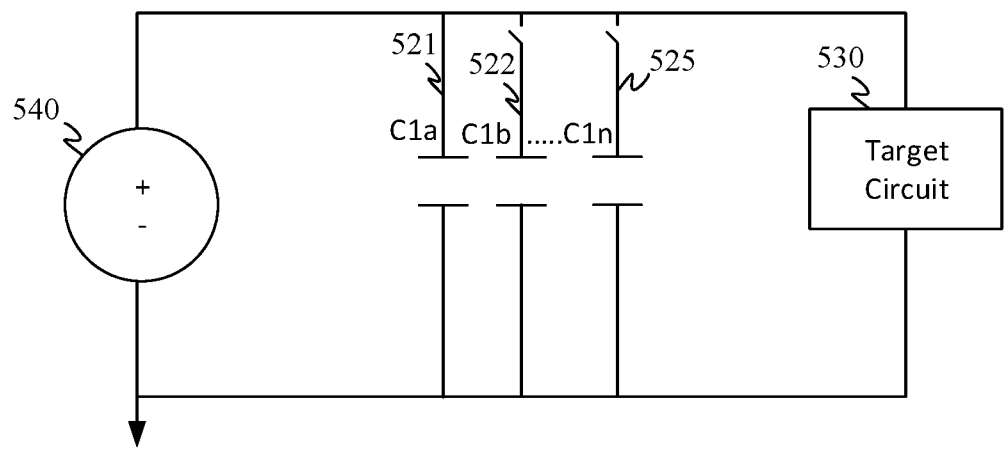

Referring to FIG. 5C, for the time TA3, the context-aware controller may have determined from context that the high level activity is being (or will be) carried out and generates control signals to connect sufficient number of charge storage devices to support appropriate voltage needs of the circuit for a predefined high level activity. For example, all switches may be closed such that all charge storage devices 521, 522, 525 are coupled to the target circuit 530. In some cases, the charge storage devices 521, 522, 525 are coupled a period of time before target circuit operation begins in order to accumulate charge from the power supply 540.

Figure 5D:
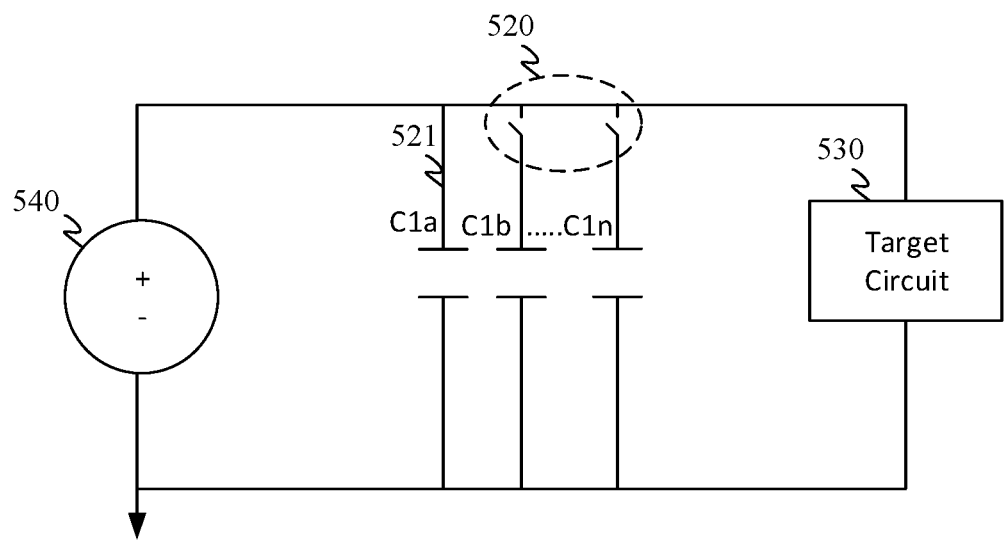

Referring to FIG. 5D, for the time TA4, the context-aware controller may have determined from context that nominal (low level) activity is being (or will be) carried out and generates control signals to connect the charge storage device 521 corresponding to a smaller capacitor, such as described with respect to FIG. 5A. As operation of the target circuit continues, the context-aware controller can determine, from the context (such as described with respect to FIGS. 2A and 2B), the level of activity of the target circuit and generate the appropriate control signals to connect and disconnect the charge storage devices of the charge storage unit to the target circuit.

It should be understood that more or fewer levels of activity may be defined for the charge storage units, resulting in more or fewer groupings of charge storage devices for connecting to the target circuit. In addition, the number of charge storage devices coupled for a particular activity level can be selected according to design choice, based on power requirements of the target circuit as well as other design considerations (e.g., parasitics, etc.) for fabricating the chip.

Figure 6A:
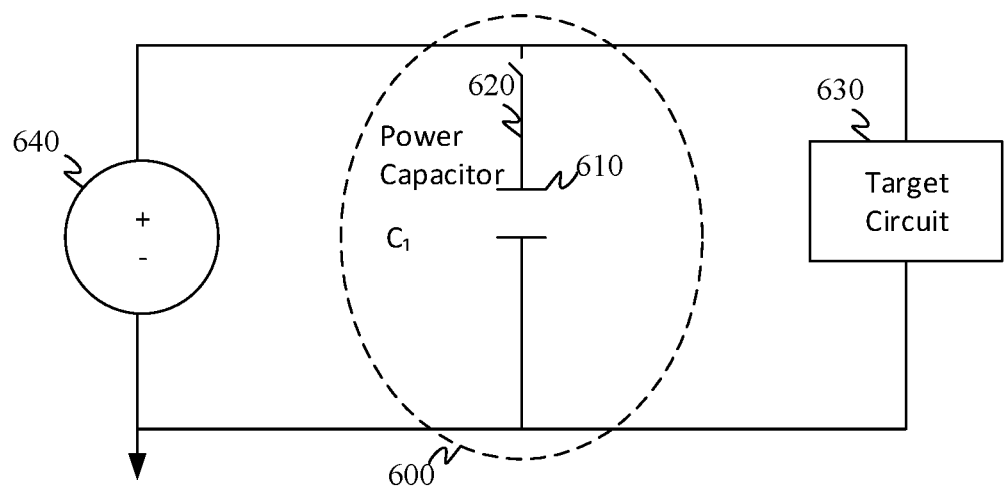
FIGS. 6A and 6B illustrate another example application of a configurable charge storage network for supplying power for the example activity profile of FIG. 1B.
Figure 6B:
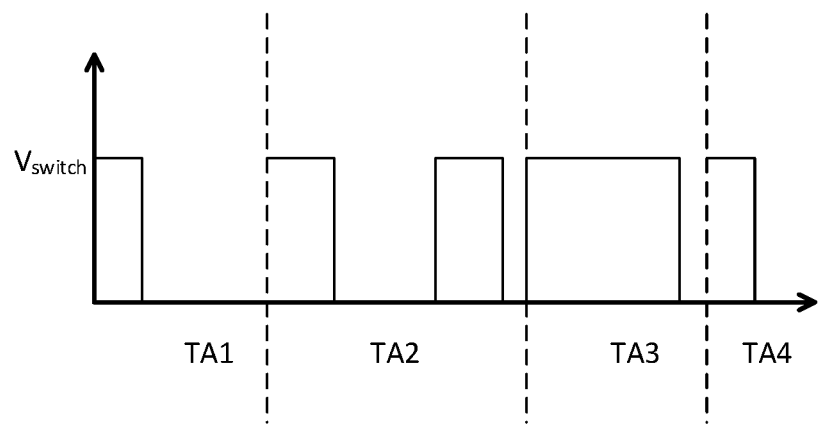

FIGS. 6A and 6B illustrate another example application of a configurable charge storage network for supplying power for the example activity profile of FIG. 1B. Referring to FIG. 6A, a charge storage unit 600 may include a single charge storage device 610 and corresponding switch 620 that connects the charge storage device 610 to a target circuit 630 and to a power supply 640 directly or indirectly (e.g., other switches may be included between the power supply 640 and the charge storage unit 600). Instead of using multiple charge storage devices in parallel to increase capacitance, charge storage unit 600 operates using an amount of time to charge the charge storage device 610.

FIG. 6B illustrates an example plot of charging time for the charge storage device 610 for each activity level of FIG. 1B. As can be seen, for the time TA1, the context-aware controller may have determined from context that nominal (low level) activity is being (or will be) carried out and generates a control signal for switch 620 to connect the charge storage device 610 for a nominal charging time. For the time TA2, the context-aware controller may have determined from context that medium level activity is being (or will be) carried out and generates a control signal for switch 620 to connect the charge storage device 610 for a longer time than that occurring for TA1. In some cases, the charge storage device may be refreshed with another control signal application (see e.g., second pulse in TA2 of FIG. 6B). This refreshing may occur based on amount of time passed since last charging or based on detecting the capacitance of the charge storage device 610 falls below a certain threshold. For the time TA3, the context-aware controller may have determined from context that the high level activity is being (or will be) carried out and generates a control signal for switch 620 to connect the charge storage device 610 for a longer time than that occurring for TA1 and TA2. Then, for the time TA4 the context-aware controller may have determined from context that nominal (low level) activity is being (or will be) carried out and generates a control signal for switch 620 to connect the charge storage device 610 as described with respect to TA1.

Although a pulse width modulated signal is shown in FIG. 6B, in some cases, the varied charging of the charge storage device is accomplished using frequency modulation, or a combination of frequency modulation and pulse width modulation. For example, frequency modulation can be used such that during a high power demand activity, the frequency of the control signal for switch 620 can be increased.

In some cases, a charge storage unit can include selectable resistance paths, where the resistance of the charging path can be altered based on the determined activity level of the target circuit. For example, a lower resistance path may be selected during a time period where more power is required by the target circuit and a higher resistance path when nominal power is required.

In some cases, the charge storage units may be configured of standardized cells in order to facilitate layout during the design and/or layout and/or routing stage of a chip. Networks of charge storage units can be created to provide desired capacitance.

Figure 7:
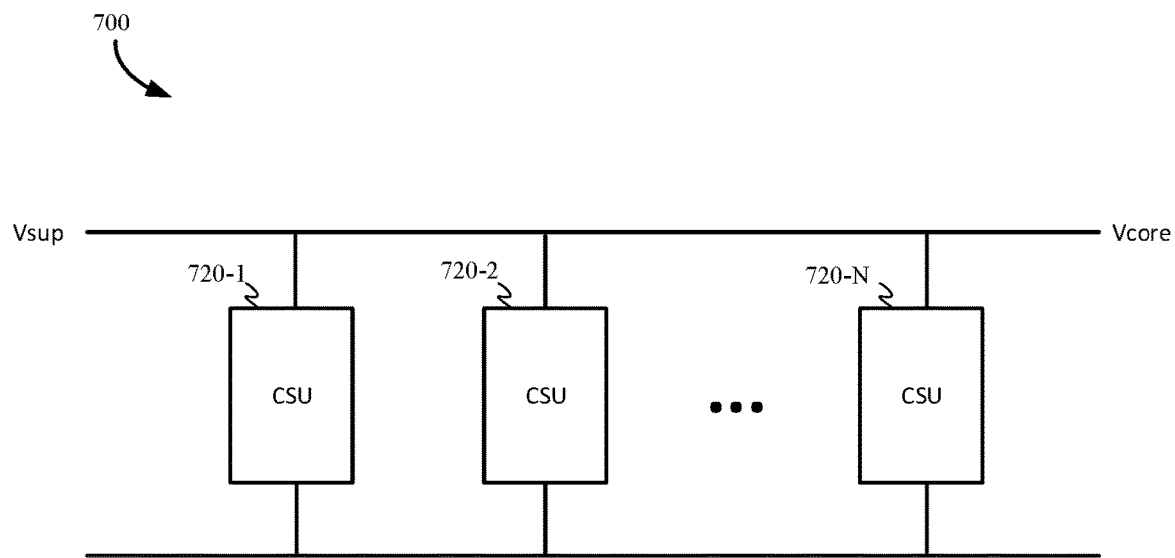
FIG. 7 illustrates an example network of charge storage units.
Figure 8:
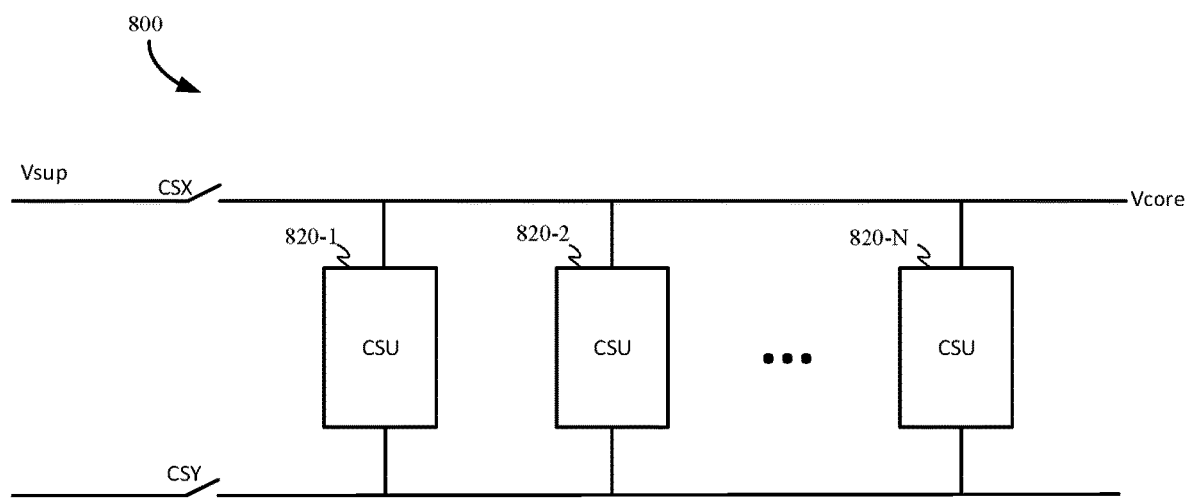
FIG. 8 illustrates another example network of charge storage units.

FIG. 7 illustrates an example network of charge storage units; and FIG. 8 illustrates another example network of charge storage units. Referring to FIG. 7, a charge storage network 700 can include a plurality of parallel charge storage units (720-1, 720-2, . . . , 720-N). Referring to FIG. 8, a charge storage network 800 can include a plurality of parallel charge storage units (820-1, 820-2, . . . , 820-N) and switches CSX and CXY that are used to isolate the charge storage network 800 from the power supply.

The CSUs of network 700 and network 800 can be implemented similar to CSU-1 320 of FIG. 3, CSU-2 420 of FIG. 4, or CSU 600 of FIG. 6A. In some cases, a combination of any of the described CSUs can be included in a same network.

Figure 9A:
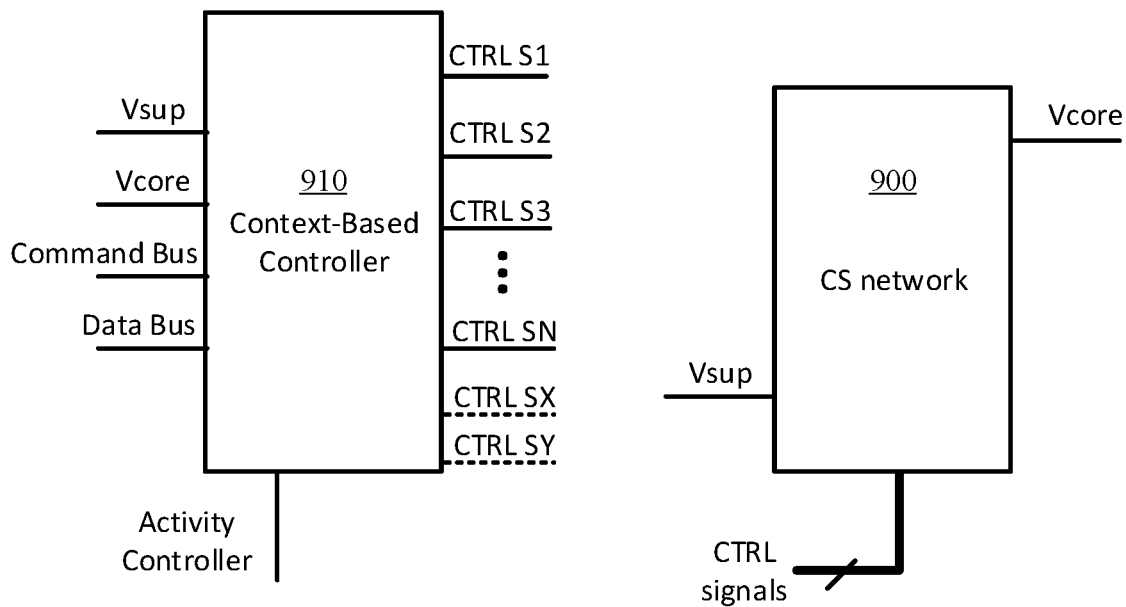
FIGS. 9A and 9B illustrate example architectures for some configurable charge storage networks.
Figure 9B:
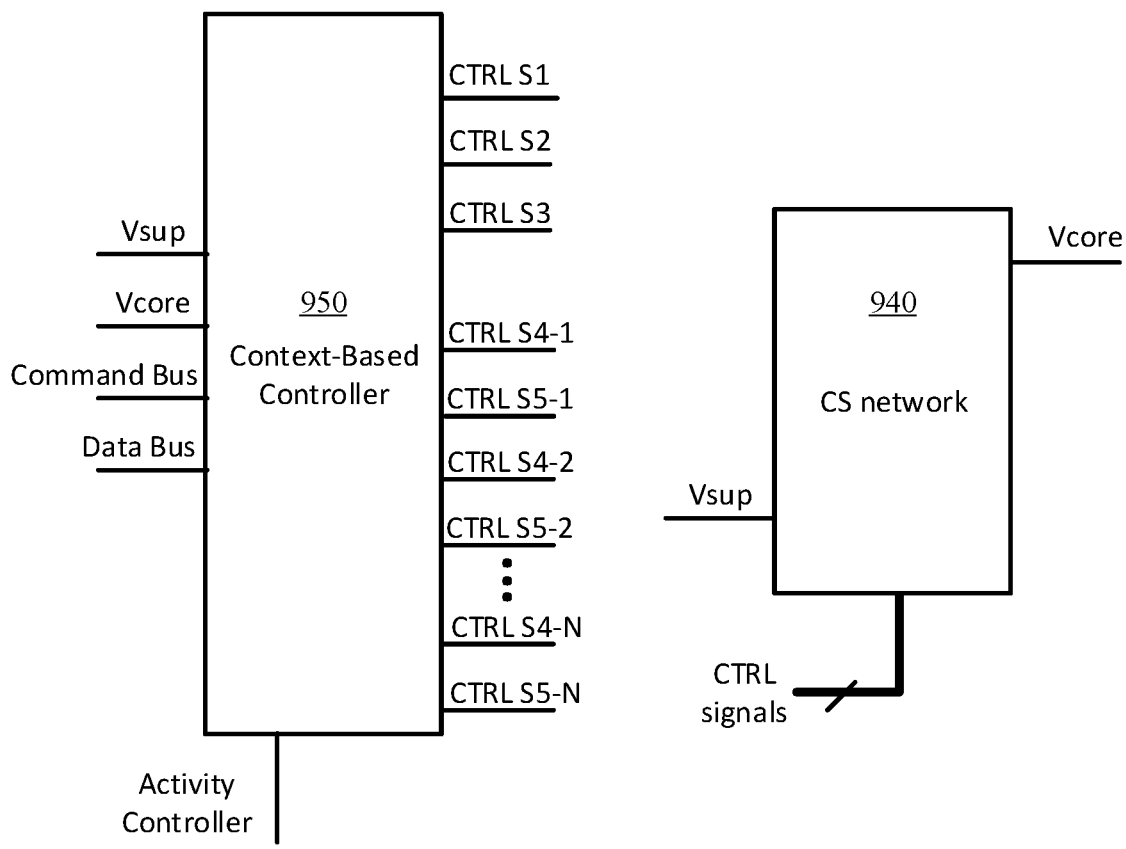

FIGS. 9A and 9B illustrate example architectures for some configurable charge storage networks. Referring to FIG. 9A, a charge storage network 900 can be controlled by a context-based controller 910. Similar to that described with respect to context-based controller 200 of FIG. 2A, context-based controller 910 can receive any number of inputs regarding circuitry operation and generate appropriate control signals for controlling the charge storage network 900. The context can be derived, for example, by monitoring the supply voltage level on the voltage supply (Vsup) and monitoring the core voltage level on the core voltage Vcore. The context can also or alternatively be derived, for example, by monitoring a command bus or a data bus. Further, in some cases the context-based controller 910 can receive an activity indicator from, for example, an activity controller or other controller or processor used in the system. To support the charge storage network, the context-based controller 910 can generate control signals for the more than one charge storage unit forming the charge storage network (e.g., as signals CTRL S1, CTRL S2, CTRL S3, . . . CTRL SN). For a case where the charge storage network is configured as charge storage network 800, the context-based controller 910 may also generate the CTRL SX and CTRL SY signals used to control switches CSX and CSY. Referring to FIG. 9B, for a case where the charge storage network 940 includes charge storage units such as CSU-2 420 described with respect to FIG. 4, the context-based controller 950 can further generate control signals to connect and disconnect the charge storage unit to the power supply at a more granular level as compared to the configuration of charge storage network 800. Of course, in some cases, charge storage units such as CSU-2 420 may be implemented in the charge storage network 800 and the context-based controller 950 may further generate the CTRL SX and CTRL SY signals used to control switches CSX and CSY.

In some cases, each charge storage unit has a corresponding context-based controller. In some cases, each charge storage network has a corresponding context-based controller. In some cases, a context-based controller can provide control signals for multiple charge storage networks. In yet other cases, a single context-based controller is provided for an entire chip.

Figure 10:
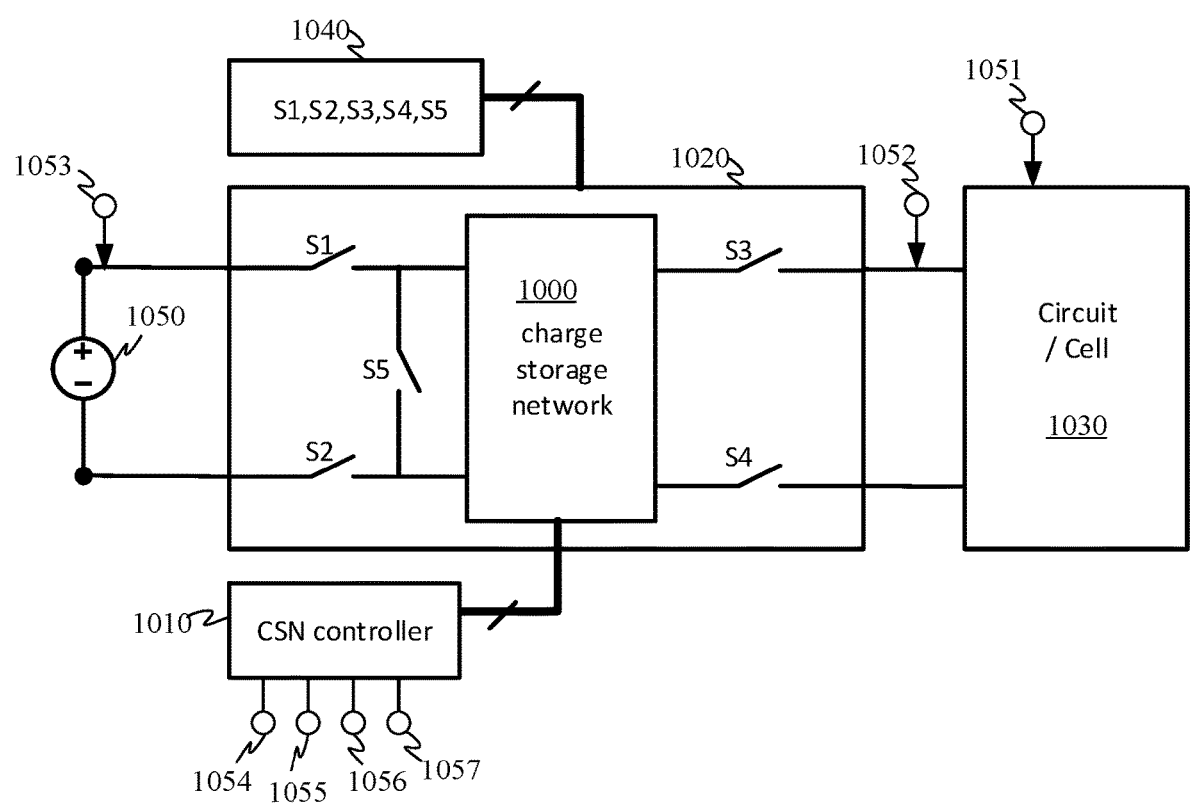
FIG. 10 illustrates an example implementation of a context aware power network applied to a clocked charge domain logic cell.

The described context aware power network can be applied to clocked charge domain logic and other secure systems. FIG. 10 illustrates an example implementation of a context aware power network applied to a clocked charge domain logic cell. Referring to FIG. 10, a charge storage network 1000 and context-based controller 1010 can be used to implement a charge storage device of an independent power supply 1020 for a circuit or cell 1030. Charge storage network 1000 can be any configuration of charge storage units and charge storage networks implemented as described herein.

In a system incorporating clocked charge domain logic, charge storage devices are controllably coupled to a circuit and/or cell of a circuit to provide external-power-supply-independent power to the circuit and/or cell. An example configuration for facilitating this external-power-supply-independent power is shown using five switches (S1, S2, S3, S4, and S5), which are controlled by a controller 1040 to connect and disconnect, in this case, the charge storage network 1000 to and from an external power source 1050 and the circuit/cell 1030. Separate from the security operations carried out by controller 1040, the context-based controller ("CSN controller") 1010, monitors any of a number of signals to determine an appropriate capacitance to make available as part of the charge storage network 1000. In some cases, the context-based controller adjusts the charging parameters associated with the power network (such as charging frequency). For example, context for the context-based controller 1010 can be derived by monitoring a command bus or a data bus (represented by tap 1051), monitoring the supply voltage level on the voltage supply 1050 (via tap 1053B), monitoring the core voltage level of the core voltage (via tap 1052), or a combination thereof. Output of the taps may be directly or indirectly input to the CSN controller 1010 via inputs 1054, 1055, 1056, 1057. Of course, the inputs may be any of those described with respect to controllers 200, 910 and 950.

As mentioned above, a context-based controller can adjust the frequency for the target circuit based on the power demand, for example, by lowering the operating frequency of the target circuit during a higher power demand situation to reduce the draw on the charge storage units; or by stalling or delaying some operations from happening in parallel, for example, when a target circuit is engaged.

The dynamic power consumption of a circuit is proportional to capacitance, voltage, and frequency. If, in a particular situation, the higher switching activity creates higher power demand (due to increase of capacitance that is being toggled during clock cycle(s)), the frequency for these operations can be lowered (by lowering the clock frequency) in order to keep the power consumption manageable. Of course, the clock frequency is still expected to be at a suitable frequency to satisfy timing constraints. In some cases, some of the non-essential operations can be scheduled to a later time in order to manage, and possibly stagger, peak power demand.

When lowering the frequency during a higher power demand situation, the operating frequency of the target circuit may be lowered, for example, by adjusting the operating clock for the target circuit. In some cases, the frequency of the clock signal is lowered. In some cases, the operating clock may be paused and/or a different clock signal may be applied (e.g., having different characteristics such as jitter, noise, slew rate, etc.).

Clock gating is one way to stall the operations. Another way is to use the control circuit to suspend a particular operation. The stalling of operations can be performed in conjunction with a scheduler or timer to manage and/or stagger operations. In some cases, the context-based controller gates the clock signal of the circuit based on the activity level of the circuit. In some cases, the context-based controller adjusts an operating frequency of the circuit based on the activity level of the circuit.

Figure 11:
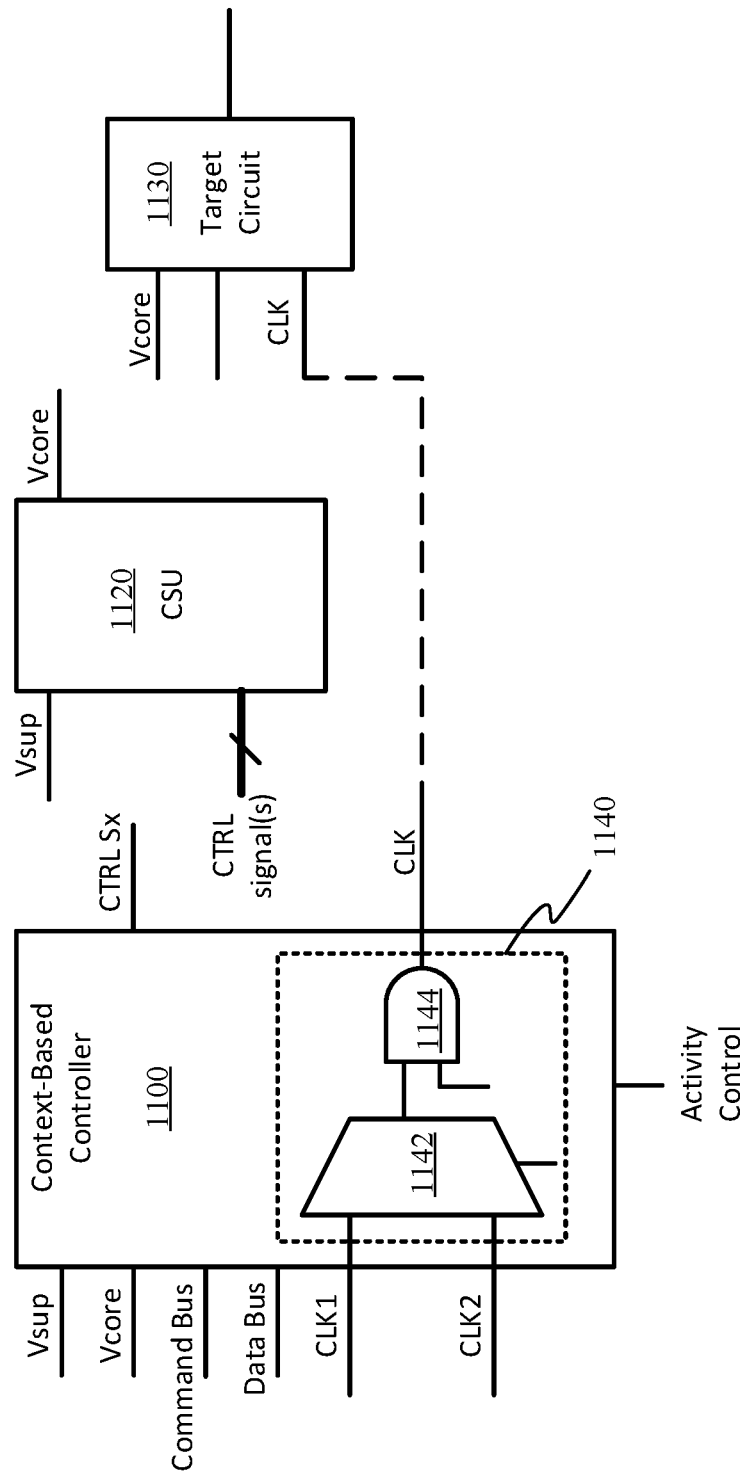
FIG. 11 illustrates an example of a system with a context-based controller that further includes clock control.

FIG. 11 illustrates an example of a system with a context-based controller that further includes clock control. The context-based controller 1100 can, in addition to generating control signals for one or more charge storage units 1120, further adjust a clock of a target circuit 1130 based on the activity level of the target circuit 1130. In the illustrated example, the context-based controller 1100 can include or communicate with some or all components of a clock control circuit 1140. Through the clock control circuit 1140, the clock (CLK) for the target circuit 1130 can be adjusted by being gated or by having its frequency or other characteristics adjusted. Here, the clock control circuit 1140 includes a selector component (represented by MUX 1142) and a clock gating circuit (represented by AND gate 1144).

The selector component enables the context-based controller 1100 to change the clock supplied to the target circuit 1130, which may be used to change the frequency at which the target circuit operates. One of a plurality of clocks can be selected to adjust the operating frequency of the circuit. For example, two or more clock signals may be selectable using an enable signal of MUX 1142. In the example, two clock signals, CLK1 and CLK2 are shown. Based on the activity level of the circuit, the selector component can select CLK1 to be output onto CLK or select CLK2 to be output onto CLK. The clock gating circuit can be used to pause the clock. For example, a static voltage (High or Low) may be selected (e.g., via an enable signal) to be output onto the CLK line to pause the clock. It should be understood that although only an AND gate is shown, the clock gating circuit can be formed of at least one sequential element and combinational element. In addition, the selector component and the clock gating circuit may be independent circuits or may be configured in series in any order.

The enable signals for the selector component and/or the clock gating circuit can be generated or obtained from the same signals used to generate the control signals for the charge storage unit(s). For example, the context can be derived by monitoring the supply voltage level on the voltage supply (Vsup) and monitoring the core voltage level on the core voltage Vcore. In some of such cases, the context-based controller 1100 selects/generates the appropriate enable signals based on the voltage drop or gradient on the voltage supply or the core voltage over time. In some cases, the context-based controller 1100 g selects/generates the appropriate enable signals based on the voltage difference between the voltage supply and the core voltage. The context can also or alternatively be derived by monitoring an activity of the circuit (e.g., actual activity data or commanded activity). For example, the context can be derived by monitoring a command bus or a data bus associated with the target circuit 1130. The context-based controller 1100 may, in some cases, monitor a sequence of commands or control signals (e.g., from the command bus associated with the target circuit 1130) and/or a sequence of data (e.g., via the data bus of the target circuit 1130). The sequence of commands or control signals or the sequence of data can be used by the context-based controller to determine activity level (and corresponding power requirement) of the target circuit 1130. In some cases, the context-based controller 1100 can receive an activity indicator from, for example, an activity controller or other controller or processor used in the system. In some cases, a combination of any of the above-mentioned context may be used by the context-based controller 1100 to determine the appropriate enable signals.

For implementations using a context-aware controller to suspend a particular operation of a target circuit, a combination of any of the above-mentioned context used in the clock gating scenarios may be used to determine an appropriate suspend/enable operation signal from the context-aware controller to the target circuit or other circuitry controlling operations of the target circuit.

In any of the charge storage units described herein, the charge storage device can be, but is not limited to, a MOSFET (metal-oxide-semiconductor field effect transistor) where the gate is connected to the source, drain, and (in some cases) body terminals, a MOS (metal-oxide-semiconductor) capacitor, a MIM (metal-insulator-metal) capacitor, a MOM (metal-oxide-metal) capacitor, a discrete capacitor, or a charge coupled device.

In any of the charge storage units described herein, the switches may be implemented by transistors. Any suitable transistor known in the art can be used, e.g., a bipolar junction transistor, a metal oxide semiconductor field effect transistor (MOSFET), or a combination thereof. Each MOSFET used can either be a p-type MOSFET (PMOS) or an n-type MOSFET (NMOS). In some cases, a transmission-gate configuration can be used. In some cases, diodes may be used as one or more of the switches. In yet another cases, micro-electro-mechanical systems (MEMS)-based switches may be used.

As illustrated herein, in a first example, a system comprises a circuit; a power network coupled to the circuit to provide a core voltage to the circuit; and a context-based controller that monitors a supply voltage level of a power supply, monitors a core voltage level of the core voltage, and monitors activity of the circuit to derive an activity level of the circuit; and based on the activity level of the circuit, adjusts a capacitance of the power network or charging parameters associated with the power network to correspond to a power requirement associated with the activity level. The context-based controller can operate as described in any of the implementations herein.

In second example according to the first example, the power network comprises at least one charge storage unit, each of the at least one charge storage unit comprising: a plurality of charge storage devices connected in parallel by corresponding switches controlled by the context-aware controller.

In a third example according to the second example, the power network further comprises: a network-level switch controllably coupling and uncoupling the at least one charge storage unit to and from the supply voltage.

In a fourth example according to the first example, the power network comprises: at least one charge storage unit, each of the at least one charge storage unit comprising: a plurality of charge storage devices connected in parallel by corresponding switches controlled by the context-aware controller; and a switch controllably coupling and uncoupling the plurality of charge storage devices to and from the supply voltage.

In a fifth example according to the fourth example, the power network further comprises: a network-level switch controllably coupling and uncoupling the at least one charge storage unit to and from the supply voltage.

In a sixth example according to the first example, the power network comprises: at least one charge storage unit, each of the at least one charge storage unit comprising: a charge storage device; and a switch coupled to the charge storage device, wherein the context-aware controller adjusts the capacitance of the power network or the charging parameters associated with the power network by generating control signals to connect and disconnect the switch to the power supply for a length of time to correspond to the power requirement associated with the activity level.

As illustrated herein, in a seventh example, a context-aware power network comprises: at least one charge storage unit; and a context-based controller comprising at least one input receiving a context of circuitry operation; and at least one control signal output, the at least one control signal output being coupled to the at least one charge storage unit, wherein the context-based controller determines an activity level for a circuit based on the context of the circuitry operation received via the at least one input, and generates at least one control signal to output via the at least one control signal output based on a power requirement corresponding to the determined activity level. The context-based controller can operate as described in any of the implementations herein.

In an eighth example according to the seventh example, the power network comprises: at least one charge storage unit, each of the at least one charge storage unit comprising: a plurality of charge storage devices connected in parallel by corresponding switches controlled by the context-aware controller.

In a ninth example according to the eighth example, the power network further comprises: a network-level switch controllably coupling and uncoupling the at least one charge storage unit to and from the supply voltage.

In a tenth example according to the seventh example, the power network comprises: at least one charge storage unit, each of the at least one charge storage unit comprising: a plurality of charge storage devices connected in parallel by corresponding switches controlled by the context-aware controller; and a switch controllably coupling and uncoupling the plurality of charge storage devices to and from the supply voltage.

In an eleventh example according to the tenth example, the power network further comprises: a network-level switch controllably coupling and uncoupling the at least one charge storage unit to and from the supply voltage.

In a twelfth example according to the seventh example, the power network comprises: at least one charge storage unit, each of the at least one charge storage unit comprising: a charge storage device; and a switch coupled to the charge storage device, wherein the context-aware controller adjusts the capacitance of the power network or the charging parameters associated with the power network by generating control signals to connect and disconnect the switch to the power supply for a length of time to correspond to the power requirement associated with the activity level.

The functionality, methods and processes described herein can be implemented, at least in part, by one or more hardware modules (or logic components). For example, the hardware modules can include, but are not limited to, application-specific integrated circuit (ASIC) chips, field programmable gate arrays (FPGAs), system-on-a-chip (SoC) systems, complex programmable logic devices (CPLDs) and other programmable logic devices now known or later developed. When the hardware modules are activated, the hardware modules perform the functionality, methods and processes included within the hardware modules.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A system comprising:
a circuit;
a power network coupled to the circuit to provide a core voltage to the circuit; and
a context-based controller that:
monitors a supply voltage level of a power supply, monitors a core voltage level of the core voltage, and monitors activity of the circuit to derive an activity level of the circuit, wherein the context-based controller monitors the activity of the circuit by monitoring a sequence of commands or control signals from a command bus to the circuit or by monitoring a sequence of data from a data bus of the circuit; and
based on the activity level of the circuit, adjusts a capacitance of the power network or charging parameters associated with the power network to correspond to a power requirement associated with the activity level.

2. The system of claim 1, wherein the context-based controller derives the activity level from the supply voltage level based on a voltage drop or gradient on the power supply.

3. The system of claim 1, wherein the context-based controller derives the activity level from the core voltage level based on a voltage drop or gradient on the core voltage.

4. The system of claim 1, wherein the context-based controller derives the activity level from the supply voltage level and the core voltage level based on a voltage difference between the supply voltage level and the core voltage level.

5. The system of claim 1, wherein the context-based controller derives the activity level based on the sequence of commands or control signals from the command bus to the circuit.

6. The system of claim 1, wherein the context-based controller derives the activity level based on the sequence of data from the data bus of the circuit.

7. The system of claim 1, wherein the context-based controller further comprises an input for receiving an activity level indicator; and, based on the activity level indicator received via the input for receiving the activity level indicator, adjusts the capacitance of the power network or the charging parameters associated with the power network to correspond to the power requirement associated with the activity level corresponding to the activity level indicator.

8. The system of claim 1, wherein the context-based controller adjusts the capacitance of the power network or the charging parameters associated with the power network by generating control signals to connect and disconnect appropriate switches of the power network.

9. The system of claim 1, wherein the context-based controller further adjusts a clock of the circuit based on the activity level of the circuit.

10. The system of claim 9, wherein the context-based controller gates the clock to the circuit based on the activity level of the circuit.

11. The system of claim 9, wherein the context-based controller adjusts an operating frequency of the circuit based on the activity level of the circuit.

12. A context-aware power network, comprising:
at least one charge storage unit; and
a context-based controller comprising at least one input receiving a context of circuitry operation, wherein the at least one input receiving the context of circuitry operation comprises a command bus input for monitoring a sequence of commands or control signals from a command bus to a circuit or a data bus input for monitoring a sequence of data from a data bus of the circuit; and at least one control signal output, the at least one control signal output being coupled to the at least one charge storage unit;
wherein the context-based controller:
determines an activity level for the circuit based on the context of the circuitry operation received via the at least one input, and
generates at least one control signal to output via the at least one control signal output based on a power requirement corresponding to the determined activity level.

13. The network of claim 12, wherein the context-based controller determines the activity level for the circuit by monitoring a supply voltage level of a power supply and monitoring a core voltage provided to the circuit to derive the activity level of the circuit.

14. The network of claim 12, wherein the context-based controller determines the activity level for the circuit by monitoring activity of the circuit based on the sequence of commands or control signals or from the sequence of data to derive the activity level of the circuit.

15. The network of claim 12, wherein the context-based controller further adjusts a clock of the circuit based on the power requirement corresponding to the determined activity level.

16. The network of claim 15, wherein the context-based controller comprises a clock gating circuit, the context-based controller gating the clock to the circuit based on the activity level of the circuit.

17. The network of claim 16, wherein the clock gating circuit comprises at least one sequential element and combinational element.

18. The network of claim 15, wherein the context-based controller adjusts an operating frequency of the circuit based on the activity level of the circuit.

19. The network of claim 18, wherein the context-based controller comprises a clock selector that, based on the activity level of the circuit, selects one of a plurality of clocks to adjust the operating frequency of the circuit.

20. The network of claim 15, wherein the context-based controller adjusts the clock of the circuit by selecting one of a plurality of clocks.

* * * * *